(12) United States Patent
Ichihara et al.

(10) Patent No.: US 7,378,656 B2
(45) Date of Patent: May 27, 2008

(54) INFRARED RADIATION ELEMENT AND GAS SENSOR USING IT

(75) Inventors: Tsutomu Ichihara, Hirakata (JP); Chousei Hamada, Kadoma (JP); Koshi Akedo, Koriyama (JP); Hiroaki Kitamura, Moriguchi (JP); Hiroshi Fukshima, Kadoma (JP); Takuya Komoda, Sanda (JP); Takashi Hatai, Neyagawa (JP)

(73) Assignee: Matsushita Electric Works, Ltd., Osaka (JP)

( * ) Notice: Subject to any disclaimer, the term of this patent is extended or adjusted under 35 U.S.C. 154(b) by 173 days.

(21) Appl. No.: 10/576,951

(22) PCT Filed: Oct. 27, 2004

(86) PCT No.: PCT/JP2004/015914

§ 371 (c)(1),
(2), (4) Date: Apr. 24, 2006

(87) PCT Pub. No.: WO2005/041246

PCT Pub. Date: Jun. 5, 2005

(65) Prior Publication Data

US 2007/0090293 A1 Apr. 26, 2007

(30) Foreign Application Priority Data

Oct. 27, 2003 (JP) .............................. 2003-366366
May 26, 2004 (JP) .............................. 2004-156835

(51) Int. Cl.
*G01J 5/02* (2006.01)

(52) U.S. Cl. ................................................. 250/341.1

(58) Field of Classification Search ............. 250/341.1, 250/341.2, 341.3, 341.4, 341.5, 341.6, 341.7, 250/341.8, 493.1, 343; 216/48
See application file for complete search history.

(56) References Cited

U.S. PATENT DOCUMENTS 6,204,083 B1  3/2001  Kodato et al.

(Continued)

FOREIGN PATENT DOCUMENTS

JP          9-153640          6/1997

(Continued)

OTHER PUBLICATIONS

English language Abstract of JP 9-153640.

(Continued)

*Primary Examiner*—David P. Porta
*Assistant Examiner*—Kiho Kim
(74) *Attorney, Agent, or Firm*—Greenblum & Bernstein, P.L.C.

(57) ABSTRACT

An infrared radiation element A heat insulating layer having sufficiently smaller thermal conductivity than a semiconductor substrate, is formed on a surface in the thickness direction of the semiconductor substrate. A heating layer, which is in the form of a lamina (plane) and has larger thermal conductivity and larger electrical conductivity than the heat insulating layer, is formed on the heat insulating layer. A pair of pads 4 for energization are formed on the heating layer. The semiconductor substrate is made of a silicon substrate. The heat insulating layer and the heating layer are formed by porous silicon layers having different porosities from each other, and the heating layer has smaller porosity than the heat insulating layer. By using the infrared radiation element as an infrared radiation source of a gas sensor, it becomes possible to extend a life of the infrared radiation source.

13 Claims, 3 Drawing Sheets

U.S. PATENT DOCUMENTS

| | | |
|---|---|---|
| 6,611,085 B1 | 8/2003 | Gee et al. |
| 2002/0096492 A1* | 7/2002 | George et al. ............... 216/48 |
| 2003/0127655 A1 | 7/2003 | Choi et al. |
| 2003/0132705 A1 | 7/2003 | Gee et al. |

FOREIGN PATENT DOCUMENTS

| | | |
|---|---|---|
| JP | 10-294165 | 11/1998 |
| JP | 11-67740 | 3/1999 |
| JP | 11-274553 | 10/1999 |
| JP | 2000-236110 | 8/2000 |
| JP | 2002-236110 | 8/2000 |
| JP | 2003-218385 | 7/2003 |
| KR | 10 0270643 | 11/2000 |
| WO | 2003/019680 | 3/2003 |

OTHER PUBLICATIONS

English language Abstract of JP 10-294165.
English language Abstract of JP 2002-236110.
English language Abstract of JP 11-67740.
English language Abstract of JP 11-274553.
English Language Abstract of KR 10-0270643.
English Language Abstract of JP 2000-236110.

* cited by examiner

INFRARED RADIATION ELEMENT AND GAS SENSOR USING IT

TECHNICAL FIELD

The present invention relates to an infrared radiation element and a gas sensor using it.

BACKGROUND ART

Various kinds of analyzers that use an infrared radiation source, such as an infrared gas analyzer, have been provided. A typical infrared radiation source used in such an analyzer is a halogen lamp. However, the halogen lamp is large and has a relatively short life span, so it is difficult to apply it to a small gas sensor that detects gas using infrared rays.

So, as an infrared radiation source that can be miniaturized, an infrared radiation element formed by using a micro machining technology has been developed in many places (For example, see Japanese Non-examined Patent Publication No. 9-153640 (paragraphs [0027]-[0028], FIG. 2), Japanese Non-examined Patent Publication No. 2000-236110 (paragraphs [0017]-[0019], FIGS. 1 and 2), and Japanese Non-examined Patent Publication No. 10-294165 (paragraphs [0014]-[0015], FIG. 1)).

In the above patent documents, an infrared radiation element of a so-called micro-bridge structure is disclosed, which comprises a supporting substrate which is formed from a silicon substrate and so on by using a micro machining technology and in the form of a rectangular frame, and a wire heat generator across the supporting substrate. In the infrared radiation element having the micro-bridge structure of this kind, infrared rays are emitted from the wire heat generator by Joule heat generated by energization of the wire heat generator, and such an infrared radiation element can quickly respond to a on/off state of a current passing through the heat generator because the heat generator is surrounded by air and therefore heat capacity difference between the heat generator and its surroundings can be increased.

However, in the above infrared radiation element having the micro-bridge structure, the heat generator is subject to breakage, and it may be melted by the heat because the heat generator is in the form of a line, and only both ends of the heat generator are supported by the supporting substrate.

DISCLOSURE OF THE INVENTION

In view of the above problem, the object of the present invention is to provide an infrared radiation element that can have a long life, as compared with a conventional one, and a gas sensor using the infrared radiation element.

The infrared radiation element of the present invention comprises a semiconductor substrate, a porous heat insulating layer formed on a surface of the semiconductor substrate and having smaller thermal conductivity than the semiconductor substrate, and a heating layer formed on the heat insulating layer and having larger thermal conductivity and larger electric conductivity than the heat insulating layer and emitting infrared rays when being energized.

Therefore, because, in this infrared radiation element, the heating layer, which emits the infrared rays when being energized, is formed into a planar shape and is supported on the porous heat insulating layer, it is possible to increase the amount of radiation of the infrared rays, and it is possible to extend the life of the infrared radiation element.

Preferably, the semiconductor substrate is a silicon substrate, and the heat insulating layer and the heating layer each are a porous silicon layer, and the heating layer has smaller porosity than the heat insulating layer. More preferably, the porosity of the heating layer is 2-45%, and a porosity of the heat insulating layer is 40-80% and is more than 10% larger than that of the heating layer.

More preferably, the heating layer is doped with an impurity so that the electric conductivity becomes higher than that of the silicon substrate and its temperature coefficient of resistance becomes positive.

The heating layer may be a carbon layer with conductivity or an amorphous silicon layer given conductivity by impurity doping. It is preferable that the amorphous silicon layer has a higher doping concentration on a surface side than on a heat insulating layer side.

It is also preferable that many concavities and convexities are formed in the surface of the heating layer.

It is also preferable that multiple layers for restricting a wavelength band of the infrared rays emitted to the outside are piled on the surface of the heating layer.

It is also preferable that a reflection coating is piled on the opposite surface of the semiconductor substrate, and the reflection coating reflects, to a heating layer side, the infrared rays emitted from the heating layer toward a semiconductor substrate side.

It is also preferable that a thermal insulating member having smaller thermal conductivity than the semiconductor substrate is provided on the opposite surface of the semiconductor substrate.

It is also preferable that the heating layer is formed on the heat insulating layer through an insulating layer having smaller electric conductivity than the heat insulating layer.

BEST MODE FOR CARRYING OUT THE INVENTION

Hereinafter, an infrared radiation element (A) of the present invention will be described in more detail with reference to the accompanying drawings.

The infrared radiation element (A) of the present invention is an infrared radiation element which emits infrared rays from a heating layer 3 by heating a heating layer 3 by energization of the heating layer 3. In the infrared radiation element (A), a heat insulating layer 2, which is porous and has sufficiently smaller thermal conductivity than a semiconductor substrate 1, is formed on a surface in the thickness direction of the semiconductor substrate 1 (namely, on an upper surface of FIG. 1), and the heating layer 3, which is in the form of a lamina (a plane) and has larger thermal conductivity and larger electrical conductivity than the heat insulating layer 2, is formed on the heat insulating layer 2, and a pair of pads (electrodes) 4 for energization are formed on the heating layer 3. The semiconductor substrate 1 has a rectangular planar shape, and the heat insulating layer 2 and the heating layer 3 each also have a rectangular planar shape. The pair of the pads 4 is made of metallic material, such as gold, and is in contact with the heating layer 3 on both ends of the heating layer 3.

Figure 1:
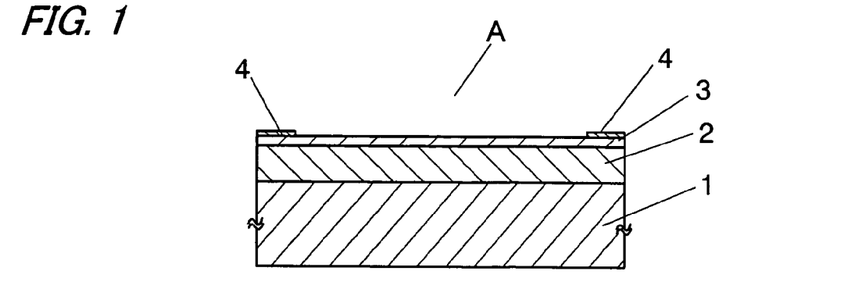
FIG. 1 is a schematic sectional view of an infrared radiation element in accordance with an embodiment of the present invention.

The heat insulating layer 2 and the heating layer 3 are formed by porous silicon layers having different porosities from each other, and the heating layer 3 is formed by a porous silicon layer having smaller porosity than the heat insulating layer 2. Preferably, the heating layer 3 is a porous silicon layer whose porosity is 2-45% (hereinafter, this silicon layer is called a first porous silicon layer), and the heat insulating layer 2 is a porous silicon layer whose porosity is 45-80% and is more than 10% larger than the porosity of the heating layer 3 (hereinafter this silicon layer is called a second porous silicon layer). Especially, it is preferable that the porosity of the heating layer 3 is about 40%, and the porosity of the heat insulating layer 2 is about 70%. Generally, the thermal conductivity and the heat capacity of the porous silicon layer become smaller as the porosity of it increases. For example, the thermal conductivity of a porous silicon layer whose porosity is 60%, which was formed by anodization of a monocrystal silicon substrate (that is, the porosity of it is 0%) whose thermal conductivity is 168[W/(m·K)] and whose heat capacity is 1.67*10⁶[J/(m³·K)], is 1[W/(m·K)], and the heat capacity of the porous silicon layer is 0.7*10⁶[J/(m³·K)]. Therefore, because the porosity of the heating layer 3 is smaller than that of the heat insulating layer 2, the thermal conductivity and the heat capacity of the heating layer 3 are larger than those of the heat insulating layer 2. Whether the porous silicon layer serves as the heating layer or as the heat insulating layer is not determined by absolute porosity of the porous silicon layer, and the difference of the porosity between the heating layer and the heat insulating layer is important for deciding it.

The heat insulating layer 2 and the heating layer 3 are formed by anodizing a part of a monocrystal silicon substrate used as the semiconductor substrate 1 in a hydrogen fluoride solution. The heat insulating layer 2 and the heating layer 3 can be formed continuously by appropriately changing a condition for the anodization process (for example, current density and processing time).

As to the dimensions of the infrared radiation element (A), for example, the thickness of the semiconductor substrate 1, before the heat insulating layer 2 and the heating layer 3 are formed, is 625 μm, the thickness of the heat insulating layer 2 is 50 μm, and the thickness of the heating layer 3 is 1 μm, and the thickness of the pad 4 is 0.1 μm. Preferably, the thickness of the heat insulating layer 2 is 50 μm or more, and the thickness of the heating layer 3 is 3 μm or less.

In the infrared radiation element (A) configured as above, because the heating layer 3 as a heat generator is in the form of a plane (a lamina), not in the form of a line as the conventional one, it is possible to increase the amount of radiation of the infrared rays, and therefore it is possible to extend the life-span of the infrared radiation element by reducing the amount of radiation per unit area. Furthermore, because the whole surface of the heating layer 3 is supported on the heat insulating layer 2, the heating layer 3 is hardly damaged, as compared with a conventional structure in which both ends of a linear heat generator is supported, and therefore it is possible to extend the life-span of the infrared radiation element. Still furthermore, because the heating layer 3 is supported by the heat insulating layer 2 having high porosity, the heating layer 3 is supported in a condition near air, whereby a heat capacity difference between the heating layer 3 and the environment becomes large and the infrared radiation element can have good thermal responsiveness.

In the infrared radiation element (A), a peak wavelength of the infrared rays emitted from the heating layer 3 is determined according to the temperature of the heating layer 3, and the peak wavelength can be expressed by the following equation:

$$\lambda = 2898/T \qquad \text{(eq. 1)}$$

where λ represents the peak wavelength, T represents absolute temperature [K] of the heating layer 3.

Figure 2:
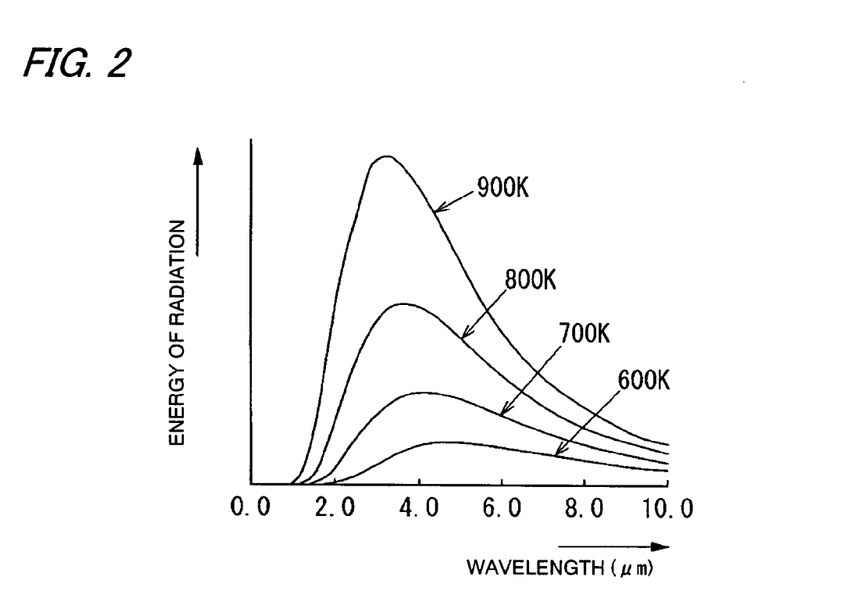
FIG. 2 is a view for explaining infrared rays emitted by the infrared radiation element of FIG. 1.

That is, in this embodiment, the first porous silicon layer as the heating layer 3 constitutes a pseudo black body, and the absolute temperature of the heating layer 3 and the peak wavelength of the infrared rays emitted from the heating layer 3 meet Wien's displacement law. For example, when a depth of each micropore of the first porous silicon layer is set to three times or more of an inside diameter of each micropore, it is possible to regard the heating layer 3 as the pseudo black body which emits the infrared rays, like blackbody radiation. Therefore, as shown in FIG. 2, the peak wavelength of the infrared rays emitted from the heating layer 3 can be varied by modulating the voltage applied, from an external source, to between the pair of pads 4 and changing the absolute temperature T of the heating layer 3 (that is, by changing the Joule heat generated by the heating layer 3). For example, when a voltage of about 300V is applied to between the pair of pads 4, the infrared rays whose peak wavelength is about 3 μm-4 μm can be emitted.

In addition, a temperature increase value ΔT [K] of the heating layer 3 at the time when input power is applied to the heating layer 3 at room temperature (300 [K]) can be expressed by the following equation:

$$\Delta T = 2fe/\beta \qquad \text{(eq. 2)}$$

where f represents the input power applied to the heating layer 3, e represents an emissivity of the heating layer 3, and β represents thermal conductivity [W/K] of the heating layer 3.

For example, when the absolute temperature T of the heating layer 3 is 700[K], as is clear from the eq. 1, the peak wavelength λ of the infrared rays emitted from the heating layer 3 is about 4 μm, and as is clear from the FIG. 2, the peak wavelength λ moves to a short wavelength side as the absolute temperature T of the heating layer 3 is increased, and radiant energy of the infrared rays of the wavelength of 4 μm is increased. Therefore, when the heating layer 3 is formed so as to meet the following relation:

$$\Delta T = 2fe/\beta \geq 400$$

$$\therefore \beta \leq fe/200,$$

it becomes possible to radiate the infrared rays of the wavelength of 4 μm with relatively high radiant energy.

As to an input voltage given to the heat generator 3, a frequency f [Hz] of an alternating voltage that the heat generator 3 can respond to (in other words, a frequency in which the temperature of the heat generator 3 can change in response to the input voltage) can be expressed by the following equation:

$$f = a/(\pi Q t^2) \qquad \text{(eq. 3)}$$

where t[m] represents a thickness of the heat insulating layer 2, a[W/(m·K)] represents the thermal conductivity of the heat insulating layer 2, Q [J/(m³·K)] represents the heat capacity of the heat generator 3.

Therefore, when the heat insulating layer 2 is formed so as to meet the following relation:

$$f = a/(\pi Q t^2) \geq 10$$

$$\therefore a \geq 10\pi Q t^2$$

it becomes possible to make the frequency (f) 10 Hz or more.

Figure 3:
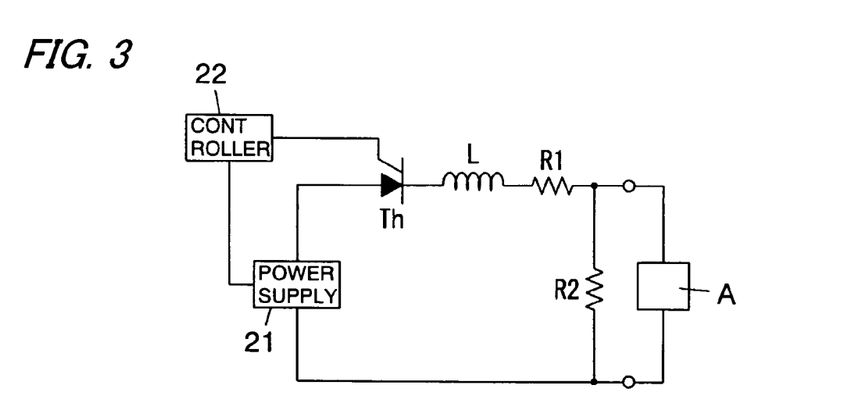
FIG. 3 is a circuit diagram showing one example of a driving circuit for the infrared radiation element of FIG. 1.

FIG. 3 shows one example of a driving circuit for driving the infrared radiation element (A). In this driving circuit, a series circuit of a thyristor Th, an inductor L, a resistor R1, and a resistor R2 is connected across a power supply 21, and the infrared radiation element (A) is connected across the resistor R2. The power supply 21 comprises a DC power supply and a capacitor connected across the DC power supply. The driving circuit further has a controller 22, which gives a control signal to a gate of the thyristor Th when the voltage across the capacitor of the power supply 21 exceeds a predetermined threshold value. When the control signal is given to the thyristor Th from the controller 22, the thyristor Th is turned on, whereby a voltage is applied to between the pads 4 of the infrared radiation element (A), the heating layer 3 generates heat, and infrared rays are emitted. By changing the threshold value of the controller 22 appropriately, it is possible to vary the voltage applied to the infrared radiation element (A), and therefore it is possible to control the peak wavelength of the infrared rays emitted from the infrared radiation element (A).

In a preferred embodiment, impurities are heavily doped in the heating layer 3 so that the electric conductivity of the heating layer 3 becomes higher than that of the semiconductor substrate 1 and the temperature coefficient of resistance becomes positive. Generally, a porous silicon layer has high resistivity and the temperature coefficient of resistance is negative, so there is a need to apply high voltage to between the pair of pads 4 to heat the porous silicon layer. And furthermore, because the resistance of the porous silicon layer becomes low as the temperature rises and therefore the current passing through between the pair of pads 4 increases rapidly, thermal controllability becomes deteriorated. Therefore, by heavily doping impurities in the heating layer 3 so that the electric conductivity of the heating layer 3 becomes higher than that of the semiconductor substrate 1 and the temperature coefficient of resistance becomes positive, the resistance of the heating layer 3 increases as the temperature rises, and the current value of the current flowing to the heating layer 3 decreases, whereby it becomes easy to control the temperature of the heating layer 3. Concretely speaking, for example, after the first porous silicon layer and the second porous silicon layer are formed, annealing treatment is done by implanting impurity ion into the first porous silicon layer by ion implantation. By this, a heavily doped heating layer having low resistivity and having a property like metal, that is, a property that has higher electric conductivity than the semiconductor substrate 1 and has a positive temperature coefficient of resistance, can be formed. Annealing treatment may be done by implanting impurity ion into a planned site for the first porous silicon layer, before the first porous silicon layer and the second porous silicon layer are formed. Or, if the temperature coefficient of resistance of the heating layer 3 is negative, it is preferable to pass a current between the pads 4 by using a constant current source as a power source. In this case, although the resistance of the heating layer 3 is decreased as the temperature of the heating layer 3 rises, the thermal controllability is improved because the voltage between the pads 4 is also decreased.

Figure 4A:
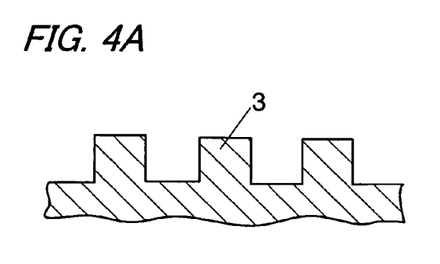
FIG. 4A is an enlarged sectional view of a preferred shape of a heating layer of the infrared radiation element of FIG. 1.
Figure 4B:
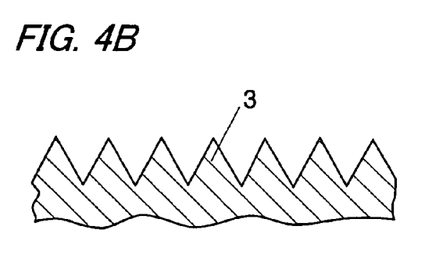
FIG. 4B is an enlarged sectional view of a preferred shape of the heating layer of the infrared radiation element of FIG. 1.

It is also preferable that many concavities and convexities, shown in FIGS. 4A and 4B for example, are formed in the surface of the heating layer 3 by etching and so on. In this case, a surface area of the heating layer 3 is increased, whereby it is possible to increase the amount of radiation of the infrared rays emitted from the heating layer 3.

Figure 5A:
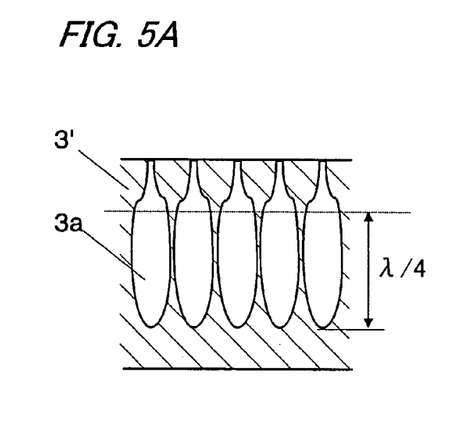
FIG. 5A is a view for explaining a preferred shape of the heating layer of the infrared radiation element of FIG. 1.
Figure 5B:
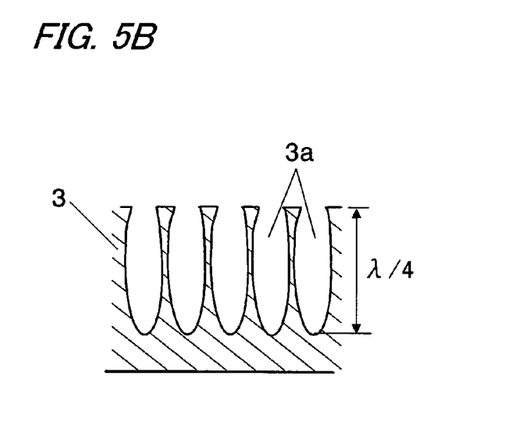
FIG. 5B is a view for explaining a preferred shape of the heating layer of the infrared radiation element of FIG. 1.

It is also preferable to form the infrared radiation element so that the depth of each micropore, which is obtained by anodizing a part of the semiconductor substrate 1 formed by a silicon substrate, becomes ¼ of the peak wavelength λ. For example, as shown in FIGS. 5A and 5B, the surface of a porous silicon layer 3', which is immediately after the anodization and where a porous structure is not exposed (that is, porosity of the surface is small), is etched by an alkaline solution including KOH and so on so that the depth H of each micropore becomes λ/4. In this case, the amount of radiation of the infrared rays can be increased by optical wave effect.

Figure 6:
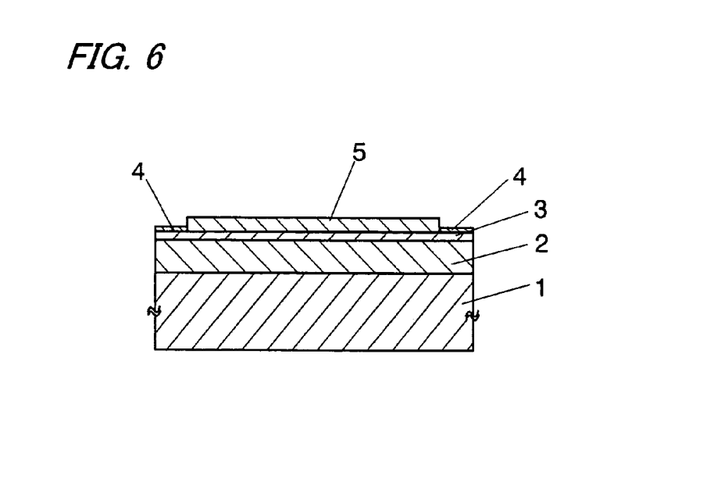
FIG. 6 is a schematic sectional view of an infrared radiation element in accordance with a preferred embodiment of the present invention.

As shown in FIG. 6, it is also preferable to pile multiple layers 5 for restricting a wavelength band of the infrared rays emitted to the outside, on the surface of the heating layer 3. In this case, the multiple layers 5 can transmit only the infrared rays of a particular wavelength band, and can restrict a radiation to the outside of the infrared rays of wavelength other than the particular wavelength band.

Figure 7:
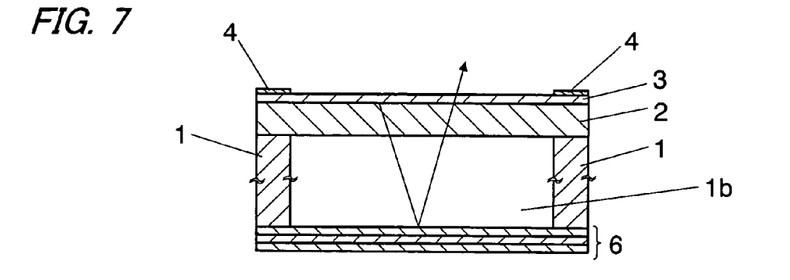
FIG. 7 is a schematic sectional view of an infrared radiation element in accordance with a preferred embodiment of the present invention.

As shown in FIG. 7, it is also preferable to pile a reflection coating 6 which comprises multiple layers and reflects, to the heating layer 3 side, the infrared rays emitted from the heating layer 3 toward the semiconductor substrate 1 side, on the undersurface of the semiconductor substrate 1. More preferably, a hollow portion 1b is formed in the semiconductor substrate 1. A medium in the hollow portion 1b is air. In this case, as shown by an arrow in FIG. 7, the infrared rays emitted from the heating layer 3 toward the semiconductor substrate 1 side are reflected to the heating layer 3 side by the reflection coating 6, whereby the amount of radiation of the infrared rays to be emitted from the surface of the heating layer 3 can be increased. The reflection coating 6 is not limited to the multiple layers, but may be formed by a metal film which reflects the infrared rays.

Figure 8:
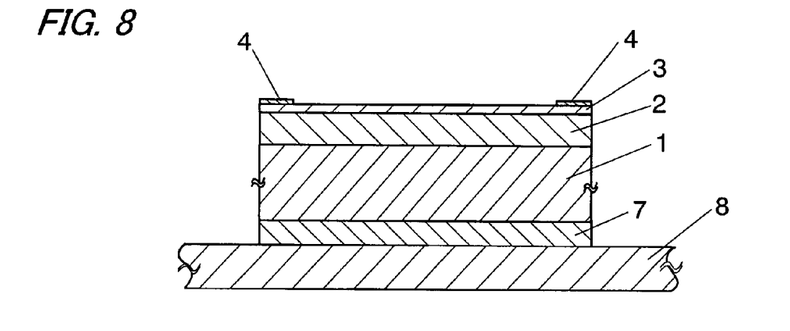
FIG. 8 is a schematic sectional view of an infrared radiation element in accordance with a preferred embodiment of the present invention.

As shown in FIG. 8, it is also preferably that a thermal insulating member 7 having smaller thermal conductivity than the semiconductor substrate 1 is provided on the undersurface of the semiconductor substrate 1, and the thermal insulating member 7 is fixed to a base member 8 by an adhesive for die-bonding. If the infrared radiation element (A) is fixed to a base member, such as a metal base of a can package and a lead frame, by die-bonding, some heat generated in the heating layer 3 may be dissipated through the heat insulating layer 2, the semiconductor substrate 1, and the base member, in some thickness of the heat insulating layer 2. Such dissipation of the heat may cause a deterioration of a response speed at the time of energization of the heating layer 3. So, by providing the thermal insulating member 7, the dissipation of the heat from the opposite surface of the semiconductor substrate 1 can be suppressed, and therefore the response speed can be increased. The thermal insulating member 7 may be an insulating glass substrate, or a porous silicon layer (a porous semiconductor layer) formed by anodizing a part of the opposite surface of the semiconductor substrate 1, for example.

Figure 9:
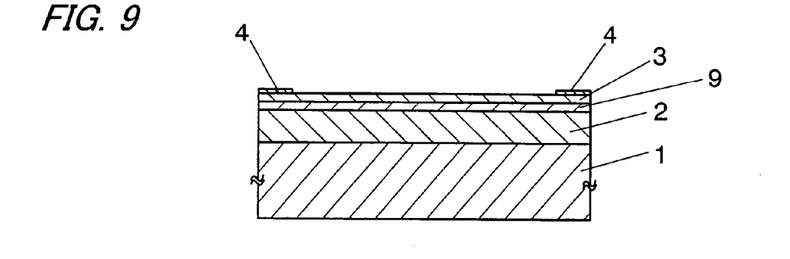
FIG. 9 is a schematic sectional view of an infrared radiation element in accordance with a preferred embodiment of the present invention.

As shown in FIG. 9, the heating layer 3 may be formed on the heat insulating layer 2 through an insulating layer 9 having smaller electric conductivity smaller than the heat insulating layer 2. By providing the insulating layer 9, a leakage current passing through the semiconductor substrate 1 in energizing the heating layer 3 can be suppressed more, whereby the response speed can be increased and power consumption can be reduced. As the material of the insulating layer 9, $SiO_2$, $Si_3N_4$, and so on may be adopted, if a silicon substrate is used as the semiconductor substrate 1.

Figure 10:
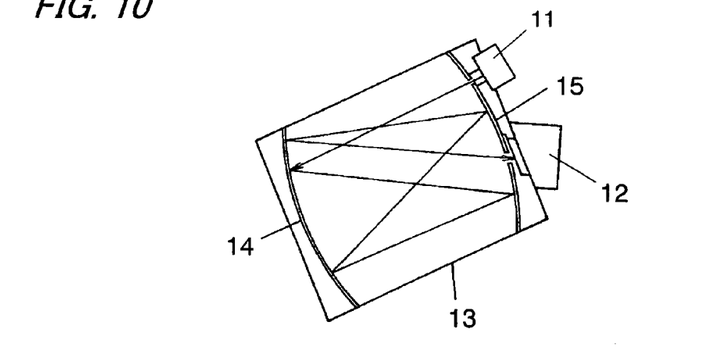
FIG. 10 is a basic configuration diagram of a gas sensor using the infrared radiation element of the present invention.

FIG. 10 shows a gas sensor having the infrared radiation element (A) as an infrared radiation source. This gas sensor comprises a gas-filled case 13, an infrared radiation source 11 with the infrared radiation element (A) for emitting infrared rays into the gas-filled case 13, a light receiving element 12 for receiving the infrared rays passing through the gas-filled case 13, two reflecting mirrors 14 and 15 placed in the gas-filled case 13 facing each other to reflect the infrared rays so that the light receiving element 12 can receive the infrared rays emitted from the infrared radiation source 11 into the gas-filled case 13, a control circuit (not shown) for controlling the output (the amount of radiation, the radiation time, and so on) of the infrared radiation source 11 and for calculating a gas concentration based on the output of the light receiving element 12, and a display (not shown) for displaying the gas concentration calculated by the control circuit. This gas sensor measures a concentration of a target gas by measuring absorbance of the infrared rays of an absorption wavelength decided by a molecular structure of the target gas.

Because this gas sensor is equipped with the infrared radiation element (A) as the infrared radiation source 11, it is possible to extend a life of the whole sensor. Furthermore, because the infrared radiation element (A) is responsive, a time that elapses before the amount of radiation in a predetermined space comes to a predetermined amount is shortened, and the light receiving element 12 can output an accurate signal that corresponds to the concentration. If the control circuit is provided with a wavelength adjustor for changing the voltage to be applied to the heating layer 3 so as to vary the wavelength of the infrared rays emitted from the heating layer 3, it becomes possible to measure concentrations of many kinds of gases.

Although, in the foregoing explanation, the heating layer 3 was formed based on the porous silicon, the heating layer 3 is not limited to this. For example, from a view point of improvement in heat resistance and mechanical strength and of lowering of resistance, the heating layer 3 may be formed by a carbon layer given conductivity by doping of impurities. As the carbon layer, various kinds of carbon layers, including amorphous carbon, graphite, graphite-like carbon, diamond, and diamond-like carbon, can be adopted. Especially, when graphite or graphite-like carbon is adopted, it is possible to reduce resistance of the carbon layer, as compared with a case where amorphous carbon, diamond, and diamond-like carbon is adopted.

Alternatively, from a viewpoint of improvement in mechanical strength and of lowering of resistance, the heating layer 3 may be formed by an amorphous silicon layer given conductivity by doping of impurities. Preferably, the amorphous silicon layer has a higher doping concentration of an impurity on the surface side than on the heat insulating layer 2 side. In this case, the current flowing through the heating layer 3 becomes easy to flow on the surface side of the heating layer 3, so that an effective thickness of the heating layer 3 becomes thin and responsiveness can be increased, as compared with a case where the whole amorphous silicon layer is doped evenly. As a substitute for the amorphous silicon layer, an amorphous semiconductor layer made of a semiconducting material except Si may be adopted.

Although the conductivity type of the silicon substrate used as the semiconductor substrate 1 may be either a P-type or a N-type, it is preferable to use a P-type silicon substrate as the semiconductor substrate 1, because a P-type silicon substrate tends to have large porosity in making a porous structure by anodization. Current density in anodizing a part of the semiconductor substrate 1 may be decided appropriately according to the conductivity type of the semiconductor substrate 1 and electric conductivity.

The material of the semiconductor substrate 1 is not limited to Si, but may be another semiconducting material which can be porous by anodization, such as Ge, SiC, GaP, GaAs, and InP.

The invention claimed is:

1. An infrared radiation element comprising:
   a semiconductor substrate;
   a porous heat insulating layer formed on a surface of said semiconductor substrate, said heat insulating layer having smaller thermal conductivity than said semiconductor substrate;
   a heating layer formed on said heat insulating layer and emitting infrared rays by being energized, said heating layer having larger thermal conductivity and electric conductivity than said heat insulating layer.

2. The infrared radiation element as set forth in claim 1, wherein
   said semiconductor substrate is a silicon substrate,
   said heat insulating layer and said heating layer each being a porous silicon layer,
   said heating layer having smaller porosity than said heat insulating layer.

3. The infrared radiation element as set forth in claim 2, wherein
   the porosity of said heating layer is 2-45%,
   a porosity of said heat insulating layer being 40-80% and being more than 10% larger than the porosity of said heating layer.

4. The infrared radiation element as set forth in claim 2, wherein
   said heating layer is doped with an impurity so that the electric conductivity becomes higher than that of the silicon substrate and its temperature coefficient of resistance becomes positive.

5. The infrared radiation element as set forth in claim 1, wherein said heating layer is formed by a carbon layer given conductivity.

6. The infrared radiation element as set forth in claim 1, wherein
said heating layer is formed by an amorphous silicon layer given conductivity by impurity doping.

7. The infrared radiation element as set forth in claim 6, wherein
said amorphous silicon layer has a higher doping concentration on a surface side than on a heat insulating layer side.

8. The infrared radiation element as set forth in claim 1, wherein
many concavities and convexities are formed in a surface of said heating layer.

9. The infrared radiation element as set forth in claim 1, wherein
multiple layers for restricting a wavelength band of the infrared rays emitted to the outside are piled on a surface of said heating layer.

10. The infrared radiation element as set forth in claim 1, wherein
a reflection coating is piled on an opposite surface of said semiconductor substrate,
said reflection coating reflecting, to a heating layer side, the infrared rays emitted from said heating layer toward a semiconductor substrate side.

11. The infrared radiation element as set forth in claim 1, wherein
a thermal insulating member having smaller thermal conductivity than said semiconductor substrate is provided on an opposite surface of said semiconductor substrate.

12. The infrared radiation element as set forth in claim 1, wherein
said heating layer is formed on said heat insulating layer through an insulating layer having smaller electric conductivity than said heat insulating layer.

13. A gas sensor comprising:

an infrared radiation source for emitting infrared rays in a predetermined space;

a light receiving means for receiving said infrared rays;

a control means for judging presence or absence of a target gas based on an output of said light receiving means by using absorption of the infrared rays of the target gas;

wherein said infrared radiation source is the infrared radiation element as set forth in claim 1. An infrared radiation element A heat insulating layer having sufficiently smaller thermal conductivity than a semiconductor substrate, is formed on a surface in the thickness direction of the semiconductor substrate. A heating layer, which is in the form of a lamina (plane) and has larger thermal conductivity and larger electrical conductivity than the heat insulating layer, is formed on the heat insulating layer. A pair of pads 4 for energization are formed on the heating layer. The semiconductor substrate is made of a silicon substrate. The heat insulating layer and the heating layer are formed by porous silicon layers having different porosities from each other, and the heating layer has smaller porosity than the heat insulating layer. By using the infrared radiation element as an infrared radiation source of a gas sensor, it becomes possible to extend a life of the infrared radiation source.

* * * * *

UNITED STATES PATENT AND TRADEMARK OFFICE
CERTIFICATE OF CORRECTION

PATENT NO. : 7,378,656 B2
APPLICATION NO. : 10/576951
DATED : May 27, 2008
INVENTOR(S) : Ichihara et al.

It is certified that error appears in the above-identified patent and that said Letters Patent is hereby corrected as shown below:

At Column 10, Line 14 delete

"An infrared radiation element A heat insulating layer having sufficiently smaller thermal conductivity than a semiconductor substrate, is formed on a surface in the thickness direction of the semiconductor substrate. A heating layer, which is in the form of a lamina (plane) and has larger thermal conductivity and larger electrical conductivity than the heat insulating layer, is formed on the heat insulating layer. A pair of pads 4 for energization are formed on the heating layer. The semiconductor susbtrate is made of a silicon substrate. The heat insulating layer and the heating layer are formed by porous silicon layers having different porosities from each other, and the heating layer has smaller porosity than the heat insulating layer. By using the infrared radiation element as an infrared radiation source of a gas sensor, it becomes possible to extend a life of the infrared radiation source"

Signed and Sealed this

Twenty-sixth Day of May, 2009

JOHN DOLL
*Acting Director of the United States Patent and Trademark Office*